(12) United States Patent
Liu et al.

(10) Patent No.: US 8,800,638 B2
(45) Date of Patent: Aug. 12, 2014

(54) HEATSINK AND HEATSINK-POSITIONING SYSTEM

(75) Inventors: Jun-Cheng Liu, Kaohsiung (TW); Cheng-Cheng Liu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 1586 days.

(21) Appl. No.: 11/514,878

(22) Filed: Sep. 5, 2006

(65) Prior Publication Data
US 2007/0240848 A1 Oct. 18, 2007

(30) Foreign Application Priority Data

Apr. 18, 2006 (TW) .............................. 95113786 A

(51) Int. Cl.
*F28F 7/00* (2006.01)
(52) U.S. Cl.
USPC .......................................... 165/80.3; 257/704
(58) Field of Classification Search
CPC .............................. H01L 23/4093; H01L 23/47
USPC .................. 165/80.3, 185, 80.4, 78; 257/704
See application file for complete search history.

(56) References Cited

U.S. PATENT DOCUMENTS

| | | | | |
|---|---|---|---|---|
| 2,772,382 A * | 11/1956 | Escoffery | ...................... | 257/658 |
| 3,945,676 A * | 3/1976 | Asamoto | ...................... | 294/202 |
| 4,607,685 A * | 8/1986 | Mitchell, Jr. | .................. | 165/80.3 |
| 4,715,637 A * | 12/1987 | Hosoda et al. | ............... | 294/86.4 |
| 5,579,827 A * | 12/1996 | Chung | ......................... | 165/80.3 |
| 5,759,007 A * | 6/1998 | Nichols et al. | ........... | 414/416.04 |
| 5,855,891 A * | 1/1999 | Lowy et al. | ................. | 424/192.1 |
| 5,982,621 A * | 11/1999 | Li | ................................... | 361/704 |
| 6,246,115 B1 * | 6/2001 | Tang et al. | .................... | 257/706 |
| 6,251,406 B1 * | 6/2001 | Haefliger et al. | .......... | 424/258.1 |
| 6,432,742 B1 * | 8/2002 | Guan et al. | .................... | 438/106 |
| 6,552,428 B1 * | 4/2003 | Huang et al. | .................. | 257/706 |
| 6,775,140 B2 * | 8/2004 | Shim et al. | .................... | 361/704 |
| 6,782,941 B2 * | 8/2004 | Lee | .................................. | 165/80.3 |
| 7,554,191 B2 * | 6/2009 | Inomata et al. | ............... | 257/706 |
| 7,582,951 B2 * | 9/2009 | Zhao et al. | .................... | 257/660 |

(Continued)

FOREIGN PATENT DOCUMENTS

| | | | | |
|---|---|---|---|---|
| JP | 2-297955 | * 12/1990 | ................... | 257/704 |
| TW | I246174 | 12/2005 | | |
| TW | I247401 | 1/2006 | | |

OTHER PUBLICATIONS

Kirnbauer et al. (2001) Papillomavirus L1 major capsid protein self-assembles into virus-like particles that are highly immunogenic, Proc. Natl. Acad. Sci. U S A., vol. 89, No. 24, pp. 12180-12184.*

*Primary Examiner* — Brandon M Rosati
(74) *Attorney, Agent, or Firm* — McCracken & Frank LLC

(57) ABSTRACT

A heatsink and a heatsink-positioning system. The heatsink-positioning system includes a heatsink and a positioning device. The heatsink includes a circular top, a ring-shaped sidewall and a plurality of foot portions. The ring-shaped sidewall connects to the circular top and extends away from the circular top. The ring-shaped sidewall has at least one first positioning portion used for fixing the heatsink. The foot portions connect to the ring-shaped sidewall and extend away from the ring-shaped sidewall. Each foot portion has an opening. The positioning device has at least one second positioning portion corresponding to the first positioning portion and is used for fixing the first positioning portion. By utilizing the heatsink-positioning system, the problem of displacement of the heatsink can be improved.

19 Claims, 4 Drawing Sheets

(56) References Cited

U.S. PATENT DOCUMENTS

| | | | |
|---|---|---|---|
| 7,743,817 B2 * | 6/2010 | Lin ............................... | 165/80.3 |
| 7,766,075 B2 * | 8/2010 | Vetrovec et al. ............. | 165/80.4 |
| 2003/0057545 A1 * | 3/2003 | Shim et al. .................... | 257/706 |
| 2003/0128520 A1 * | 7/2003 | Yang ............................. | 361/704 |
| 2004/0164404 A1 * | 8/2004 | Huang .......................... | 257/706 |
| 2005/0104195 A1 * | 5/2005 | Yang ............................. | 257/706 |
| 2005/0285258 A1 * | 12/2005 | Chen et al. .................... | 257/706 |
| 2006/0060952 A1 | 3/2006 | Yuan et al. | |
| 2007/0090502 A1 * | 4/2007 | Zhao et al. .................... | 257/675 |
| 2007/0108597 A1 * | 5/2007 | Kim et al. ..................... | 257/706 |
| 2007/0235859 A1 * | 10/2007 | Espiritu et al. ................ | 257/706 |
| 2007/0257376 A1 * | 11/2007 | Shimokawa et al. .......... | 257/778 |
| 2009/0129019 A1 * | 5/2009 | Li et al. ......................... | 361/697 |
| 2009/0288806 A1 * | 11/2009 | Lin ............................... | 165/80.3 |
| 2010/0258281 A1 * | 10/2010 | Nie et al. ....................... | 165/121 |

\* cited by examiner

HEATSINK AND HEATSINK-POSITIONING SYSTEM

BACKGROUND OF THE INVENTION

1. Field of the Invention

The invention relates to a heatsink and a heatsink-positioning system, particularly to a positioning system having a plurality of positioning portions for positioning a heatsink.

2. Description of the Related Art

Referring to FIG. 1, it shows a conventional heatsink-positioning system. The heatsink-positioning system 1 comprises a heatsink 10 and a positioning device 11. The heatsink 10 has a plurality of foot portions 101 and a top surface 102. The positioning device 11 has a fixing surface 111. The fixing surface 111 is a plane and is used for fixing the heatsink 10.

Since the top surface 102 of the conventional heatsink 10 is circular and the fixing surface 111 is a plane, the positioning device 11 can just contact the heatsink 10 by point-contact. Point-contact is a very unstable fixing method, so the heatsink 10 may rotate and then shift. Therefore, the fixing position will be unstable or fail.

Consequently, there is an existing need for providing a heatsink-positioning system to solve the above-mentioned problems.

SUMMARY OF THE INVENTION

One objective of the present invention is to provide a heatsink. The heatsink comprises a circular flat plate, a sidewall and a plurality of foot portions. The sidewall connects to the circular flat plate, extends away from the circular flat plate, and has a plurality of non-planar portions and a plurality of planar regions. One of the planar regions connects two of the non-planar portions. The planar regions are orthogonal to the radial directions of the circular flat plate and are parallel to a plurality of positioning planes of the positioning device. The planar regions and the positioning planes contact and engage each other by surface contact, so that the heatsink is fixed by the positioning device. The foot portions connect the sidewall and extend away from the sidewall, wherein one of the planar regions is disposed between two of the foot portions.

Another objective of the present invention is to provide a heatsink-positioning system. The heatsink-positioning system comprises a heatsink and a positioning device. The heatsink comprises a circular flat plate, a sidewall and a plurality of foot portions. The sidewall connects to the circular flat plate, extends away from the circular flat plate, and has a plurality of non-planar portions and a plurality of planar regions. One of the planar regions connects two of the non-planar portions, and the planar regions are orthogonal to the radial directions of the circular flat plate. The foot portions connect to the sidewall and extend away from the sidewall, wherein one of the planar regions is disposed between two of the foot portions. The positioning device has a plurality of positioning planes corresponding to the planar regions, wherein the planar regions are parallel to the positioning planes. The planar regions and the positioning planes contact and engage each other by surface contact, so that the heatsink is fixed by the positioning device.

DETAILED DESCRIPTION OF THE INVENTION

Figure 1:
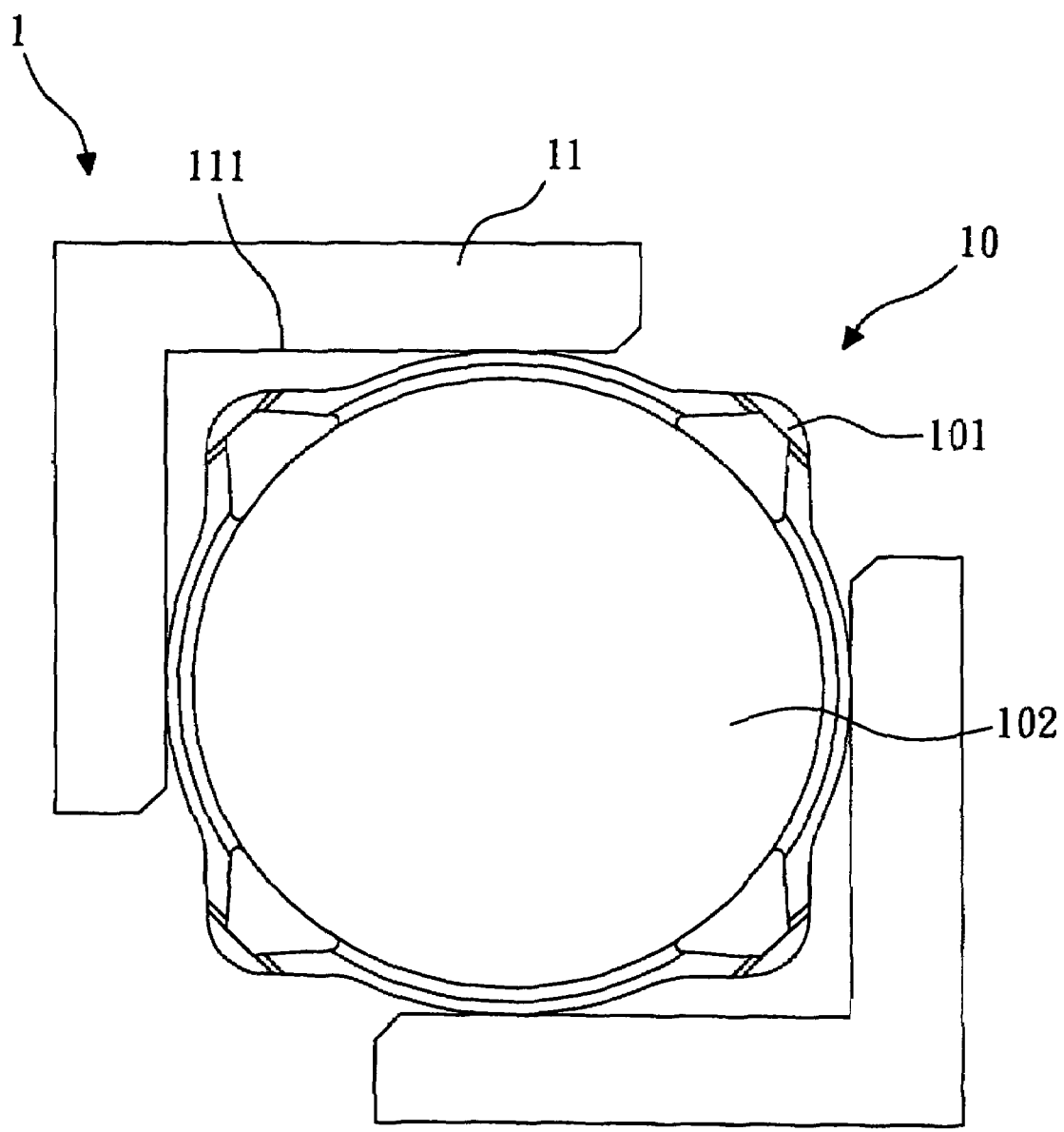
FIG. 1 shows a conventional heatsink-positioning system.
Figure 2A:
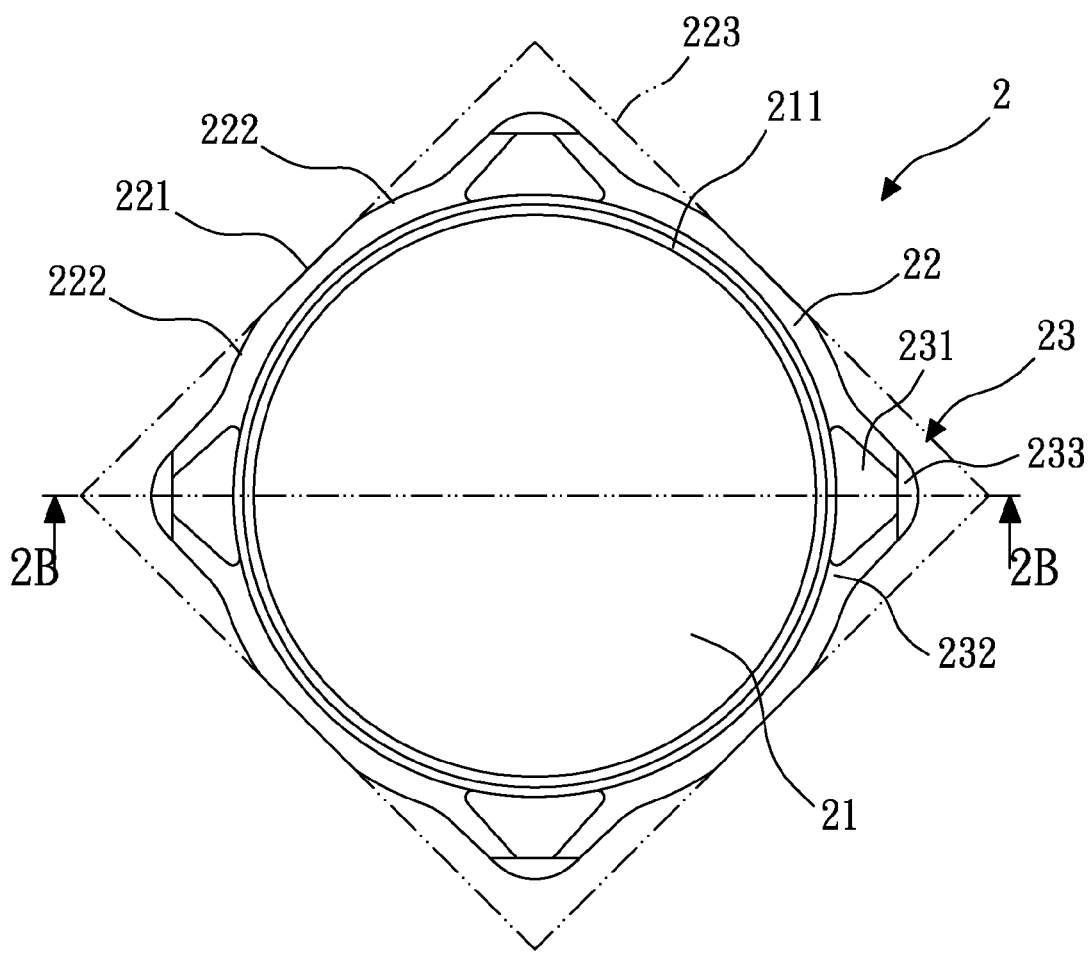
FIG. 2A shows a heatsink according to a first embodiment of the present invention.
Figure 2B:
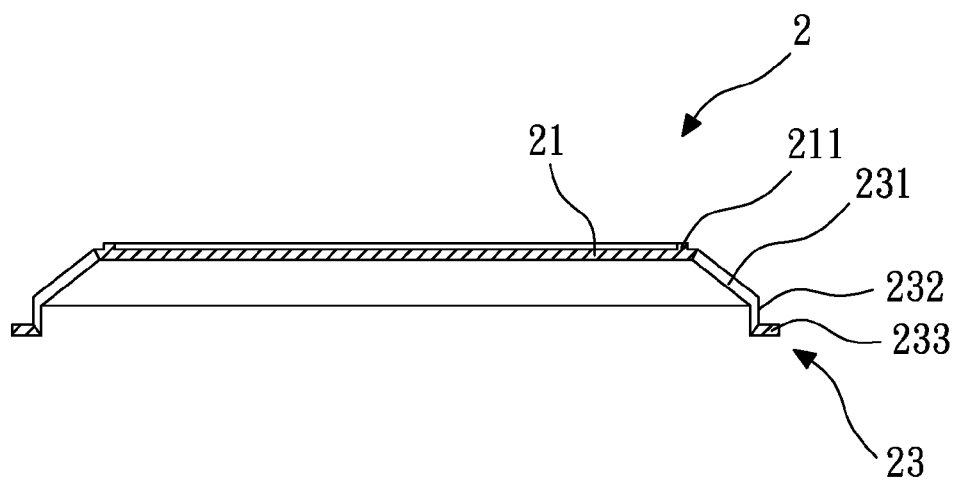
FIG. 2B shows a sectional view of the heatsink according to the first embodiment of the present invention.

Referring to FIG. 2A and FIG. 2B, they show a heatsink according to a first embodiment of the present invention, wherein FIG. 2B shows the structure of a sectional view along the line 2B-2B in FIG. 2A. The heatsink 2 of the first embodiment comprises a circular flat plate 21, a sidewall 22 and a plurality of foot portions 23. The circular flat plate 21 has a ring-shaped protrusion 211 formed on the circular flat plate 21 and near the edge of the circular flat plate 21. The ring-shaped protrusion 211 can avoid the encapsulating compound bleeding and covering the circular flat plate 21, so that the heat dissipation efficiency of the heatsink 2 will not be decreased. The sidewall 22 connects to the circular flat plate 21 and extends away from the circular flat plate 21. The sidewall 22 and the circular flat plate 21 form a hat-shaped structure. The sidewall 22 has a plurality of arched portions 222 and a plurality of planar regions 221. In this embodiment, there are four planar regions 221. The arched portions 222 and the planar regions 221 are located at the edge of the sidewall 22. The arched portions 222 are parts of a circle that is concentric with the edge of the circular flat plate 21. That is, the arched portions 222 are parallel to the edge of the circular flat plate 21. One of the planar regions 221 connects two of the arched portions 222. The planar region 221 is orthogonal to the radial direction of the circular flat plate 21. The distances between each of the planar regions 221 and the center of the circular flat plate 21 are substantially equal. That is, the phantom extension lines 223 of the four planar regions 221 form a square. One of the planar regions 221 is disposed between two of the foot portions 23. Two of the planar regions 221 are parallel to each other. The planar regions 221 are flat surfaces and are used for fixing the heatsink 2.

In the embodiment, the sidewall 22 is a single incline. The foot portions 23 connect to the sidewall 22 and extend away from the sidewall 22. The foot portions 23 and the sidewall 22 form a height difference, and each foot portion 23 has an opening 231. The foot portion 23 has a first portion 232 and a second portion 233. One end of the first portion 232 connects to the sidewall 22 and the other end of the first portion 232 connects to the second portion 233, and the second portion 233 extends away from the first portion 232 horizontally. By utilizing the foot portions 23, the circular flat plate 21 and the sidewall 22 can be supported. In addition, the heatsink 2 is made of copper, and a chromium layer or a nickel layer may be electroplated on the heatsink to avoid oxidation.

Figure 3A:
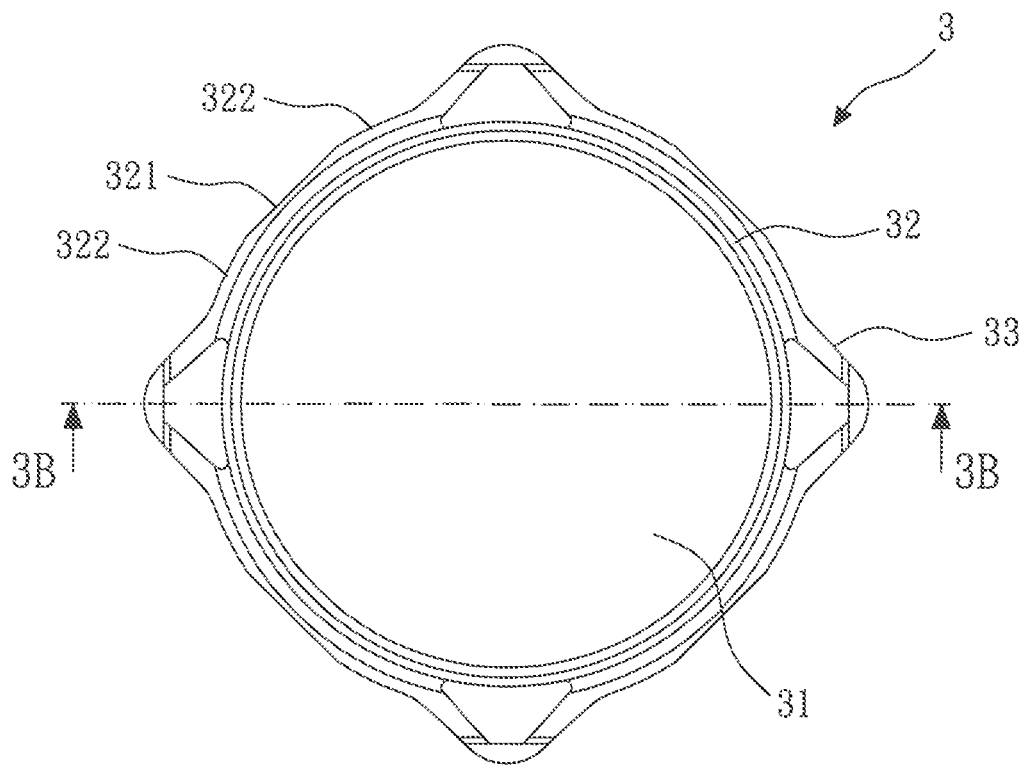
FIG. 3A shows a heatsink according to a second embodiment of the present invention.
Figure 3B:
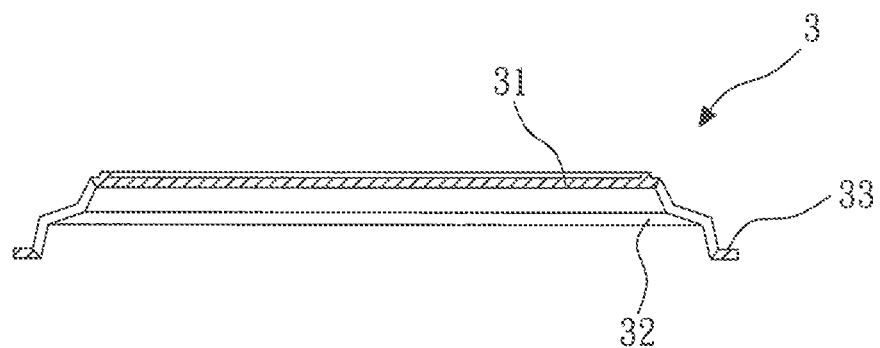
FIG. 3B shows a sectional view of the heatsink according to the second embodiment of the present invention.

Referring to FIG. 3A and FIG. 3B, they show a heatsink according to a second embodiment of the present invention, wherein FIG. 3B shows the structure of a sectional view along the line 3B-3B in FIG. 3A. The heatsink 3 of the second embodiment comprises a circular flat plate 31, a sidewall 32 and a plurality of foot portions 33. The difference between the heatsink 3 of the second embodiment and the heatsink 2 of the first embodiment is that the sidewall 32 of the second embodiment comprises a plurality of incline surfaces so as to form a curved surface, and the sidewall 32 has four planar regions 321 and eight non-planar portions 322. The non-planar portions 322 and the planar regions 321 are located at the edge of the sidewall 32. The non-planar portions 322 are parts of a circle that is concentric with the edge of the circular flat plate 31. That is, the non-planar portions 322 are parallel to the edge of the circular flat plate 31.

Figure 4:
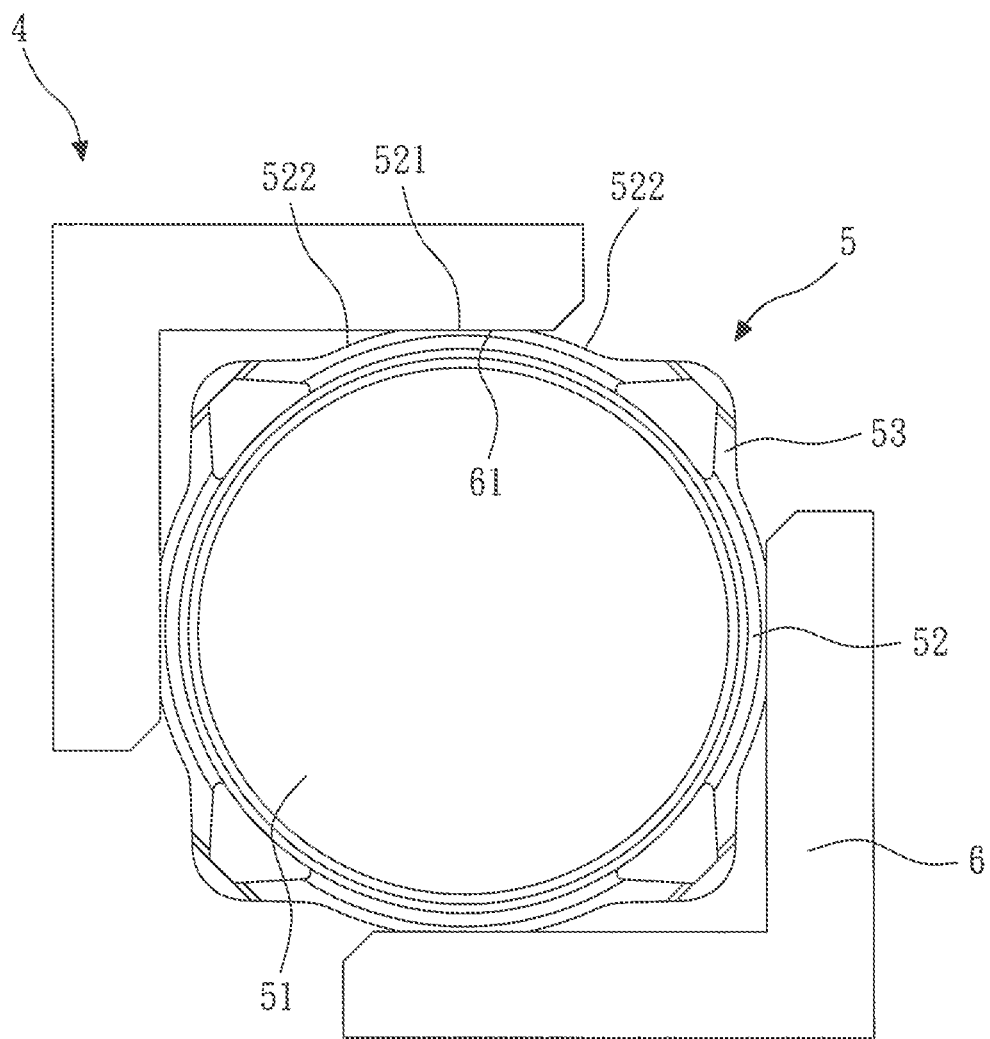
FIG. 4 shows a heatsink-positioning system of the present invention.

Referring to FIG. 4, it shows a heatsink-positioning system of the present invention. The heatsink-positioning system 4 comprises a heatsink 5 and a positioning device 6. The structure of the heatsink 5 is the same as that of the heatsink 3 of the second embodiment in FIG. 3A and FIG. 3B. The heatsink 5 comprises a circular flat plate 51, a sidewall 52 and a plurality of foot portions 53. The sidewall 52 has four planar regions 521 and eight non-planar portions 522. The non-planar portions 522 and the planar regions 521 are located at the edge of the sidewall 52. The non-planar portions 522 are parts of a circle that is concentric with the edge of the circular flat plate 51. That is, the non-planar portions 522 are parallel to the edge of the circular flat plate 51. One of the planar regions 521 connects two of the non-planar portions 522. The planar region 521 is orthogonal to the radial direction of the circular flat plate 51. One of the planar regions 521 is disposed between two of the foot portions 53. The positioning device 6 has a plurality of positioning planes 61 corresponding to the planar regions 521. The shape of the positioning plane 61 matches the shape of the planar region 521. In the embodiment, the planar regions 521 and the positioning planes 61 are flat surfaces. The positioning planes 61 are used for fixing the planar regions 521 so as to fix the heatsink 5 well. The planar regions 521 are parallel to the positioning planes 61, and the planar regions 521 and the positioning planes 61 contact and engage each other by surface contact. Therefore, the planar regions 521 are fixed by the positioning planes 61, so that the heatsink 5 is fixed by the positioning device 6, and the heatsink 5 will not rotate.

By utilizing the foot portions 53 to be a supporting structure in a packaging process with the heatsink 5, a predetermined space for containing a chip can be formed. The heatsink 5 not only protect the chip but also conduct the heat dissipation outside so as to increase the efficiency of the heat dissipation.

Since the sidewall of the heatsink of the invention has a plurality of planar regions and the positioning device has a plurality of positioning planes corresponding to the planar regions respectively, the positioning planes can firmly fix the planar regions, so that the problem of displacement of the heatsink can be improved.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A heatsink capable of engaging a positioning device comprising:
    a circular flat plate;
    a sidewall, connecting to the circular flat plate, extending away from the circular flat plate, and having a plurality of non-planar portions and a plurality of planar regions, the planar regions are orthogonal to the radial directions of the circular flat plate, wherein the distances between each of the planar regions and the center of the circular flat plate are substantially equal; and
    a plurality of equally spaced foot portions, connecting to the sidewall and extending away from the sidewall, the plurality of foot portions each having a first side and second side opposite the first side, wherein one of the non-planar portions extends away from one of the first and second sides of each foot portion, and wherein one of the planar regions is disposed between and bounded by two non-planar portions extending from two adjacent foot portions.

2. The heatsink according to claim 1, wherein the foot portion is a plane.

3. The heatsink according to claim 1, wherein the ring-shaped sidewall is a single incline.

4. The heatsink according to claim 1, wherein the sidewall comprises a plurality of incline surfaces.

5. The heatsink according to claim 1, wherein the foot portion has a first portion and a second portion, one end of the first portion connects to the sidewall and the other end of the first portion connects to the second portion, and the second portion extends away from the first portion horizontally.

6. The heatsink according to claim 1, wherein each foot portion has an opening.

7. The heatsink according to claim 1, wherein the heatsink is made of copper.

8. The heatsink according to claim 1, further comprising a chromium layer or a nickel layer, electroplated on the heatsink for avoiding oxidation.

9. The heatsink according to claim 1, further comprising a ring-shaped protrusion formed on the circular flat plate and near the edge of the circular flat plate.

10. A heatsink-positioning system comprising:
    a heatsink, comprising:
        a circular flat plate;
        a sidewall, connecting to the circular flat plate, extending away from the circular flat plate, and having a plurality of non-planar portions and a plurality of planar regions, and the planar regions are orthogonal to the radial directions of the circular flat plate, wherein the distances between each of the planar regions and the center of the circular flat plate are substantially equal; and
        a plurality of equally spaced foot portions, connecting to the sidewall and extending away from the sidewall, the plurality of foot portions each having a first side and second side opposite the first side, wherein one of the non-planar portions extends away from one of the first and second sides of each foot portion, and wherein one of the planar regions is disposed between and bounded by two non-planar portions extending from two adjacent foot portions; and
    a positioning device, having a plurality of positioning planes corresponding to the planar regions, wherein at least two of the planar regions are parallel to at least two of the positioning planes, and the at least two of the planar regions and the at least two of the positioning planes contact and engage each other by surface contact, so that the heatsink is fixed by the positioning device.

11. The heatsink-positioning system according to claim 10, wherein the shape of each of the planar regions matches the shape of each of the positioning planes.

12. The heatsink-positioning system according to claim 11, wherein the planar regions and the positioning planes are flat surfaces.

13. The heatsink-positioning system according to claim 10, wherein the ring-shaped sidewall is a single incline.

14. The heatsink-positioning system according to claim 10, wherein the sidewall comprises a plurality of incline surfaces.

15. The heatsink-positioning system according to claim 10, wherein the foot portion has a first portion and a second portion, one end of the first portion connects to the sidewall and the other end of the first portion connects to the second portion, and the second portion extends away from the first portion horizontally.

16. The heatsink-positioning system according to claim 10, wherein each foot portion has an opening.

17. The heatsink-positioning system according to claim 10, wherein the heatsink is made of copper.

18. The heatsink-positioning system according to claim 10, further comprising a chromium layer or a nickel layer, electroplated on the heatsink for avoiding oxidation.

19. The heatsink-positioning system according to claim 10, further comprising a ring-shaped protrusion formed on the circular flat plate and near the edge of the circular flat plate.

* * * * *